(12) United States Patent
Tsui et al.

(10) Patent No.: US 6,709,877 B2
(45) Date of Patent: Mar. 23, 2004

(54) APPARATUS AND METHOD FOR TESTING SEMICONDUCTOR DEVICES

(75) Inventors: Ching Man Stanley Tsui, Kowloon (HK); Eric Chow, Kowloon (HK); Curito M. Bilan, Jr., Kowloon (HK)

(73) Assignee: ASM Assembly Automation Limited, Hong Kong (HK)

( * ) Notice: Subject to any disclaimer, the term of this patent is extended or adjusted under 35 U.S.C. 154(b) by 289 days.

(21) Appl. No.: 09/910,040

(22) Filed: Jul. 23, 2001

(65) Prior Publication Data

US 2003/0017629 A1 Jan. 23, 2003

(51) Int. Cl.[7] ............................................. H01L 31/26
(52) U.S. Cl. ............................. 438/14; 438/15; 438/16; 324/158.1; 324/754; 324/755; 324/765; 414/935; 414/941; 414/816; 257/666
(58) Field of Search ............................. 324/158.1, 754, 324/765, 755; 438/14, 15, 16; 257/200, 666; 414/935, 941, 816

(56) References Cited

U.S. PATENT DOCUMENTS

| | | | | |
|---|---|---|---|---|
| 5,008,615 A | * | 4/1991 | Littlebury | 324/754 |
| 5,180,974 A | | 1/1993 | Mitchell et al. | |
| 5,440,231 A | * | 8/1995 | Sugai | 324/158.1 |
| 5,691,650 A | * | 11/1997 | Sugai | 324/755 |

* cited by examiner

Primary Examiner—Matthew Smith
Assistant Examiner—Belur Keshavan
(74) Attorney, Agent, or Firm—Burns, Doane, Swecker & Mathis, L.L.P.

(57) ABSTRACT

There is disclosed an apparatus for supporting singulated electronic devices during a testing operation, comprising: a main body and a support member, wherein said support member is made of non-conducting high-resistivity material and comprises a plurality of recesses, each said recess being adapted to receive an individual singulated device. There is also disclosed a method for testing such devices in which the devices are carried on support members through a testing process including one or more environmental control chambers.

19 Claims, 5 Drawing Sheets

APPARATUS AND METHOD FOR TESTING SEMICONDUCTOR DEVICES

FIELD OF THE INVENTION

This invention relates to an apparatus and method for the testing of semiconductor devices, and in particular to the testing of such devices in a singulated form.

BACKGROUND OF THE INVENTION

Semiconductor circuits are initially manufactured as wafers. A circular wafer of a semiconductor material such as silicon is formed with a plurality of individual circuits each of which is called a die (pl. dice). After the dice are formed on the wafer, the wafer is cut so as to separate the dice from each other and each die is then assembled into a semiconductor package with bond wires connecting the bond pads of a die with the pins of the package. A number of tests on the dice are carried out at various stages in the process. In particular, for example, a test of the devices while they are still part of the wafer is carried out. This test is known as a wafer test and is used to discard dies that have been incorrectly formed.

Once the die is assembled in a package it is tested again to ensure that the package has been properly assembled and that no damage has occurred to the die during the assembly and processing and to verify that the device still meets its design specifications. This test may be carried out at several different temperatures to check parameters that may be temperature sensitive. For example commercial devices may be tested at 0° C., 25° C. and 70° C. Devices intended for military applications may be tested at more extreme temperatures still, for example −55° C., 25° C. and 125° C.

It should also be understood that the processing of semiconductor devices is conventionally divided into two categories: front end processing and back end processing. Front end processing includes such processes as the manufacture of die bearing wafers and the separation of the dice from the wafer. Front end processing is usually highly automated. Back end processing, on the other hand, includes device assembly and packaging processes, and these processes are more widely diverse in their nature and the degrees of automation. To supply components to diverse back end processing apparatus and methods results in a number of different methods of delivering the semiconductor dice, with the main choice being between delivering the components in non-singulated form attached to a leadframe, or in a singulated form. Testing processes and apparatus, which may conventionally come between front and back end processing, may therefore need to be highly flexible and capable of testing a large number of devices with a reasonably efficient throughput so as not to slow down the manufacturing and assembly processing time.

In summary, the testing of semiconductor devices is an important part of the manufacturing process, and in order to prevent the processing time being seriously delayed, methods and apparatus need to be designed that facilitate the testing of such semiconductor devices in the most time-efficient and reliable manner possible.

PRIOR ART

When the dies are assembled into semiconductor packages, the packages are conventionally formed as part of what is called a leadframe. In the past a leadframe may include a single row of semiconductor packages, more recently however leadframes may include two or more rows of packages such that the semiconductor packages are arranged in an array. When they are attached to the leadframe, the packages are electrically isolated from each other and are physically connected to the leadframe by one or more tie bars. In this condition the devices are conventionally referred to as being non-singulated semiconductor devices. U.S. patent application Ser. No. 09/868,571 unknown filed Jun. 27 2001 entitled "Method and Apparatus for Testing Semiconductor Devices" and assigned to the assignee of the present application, the contents of which are incorporated herein by reference, describes an apparatus and method for testing non-singulated semiconductor devices.

Once the semiconductor devices have been separated from each other they are known as singulated devices. Various methods are known for testing singulated devices, but generally because the devices have been separated from the leadframe they must be tested individually one device at a time and this substantially increases the time required to test a number of such devices. This is particularly problematic when it is desired to carry out multiple tests per device, for example during environmental testing when the devices must be tested at different temperatures.

Conventionally, for example, tests on singulated devices must be carried out on substantially an individual basis. That is to say it is only possible to test one device (or at most 3 or 4) at a time. Conventionally for example, a test socket is used. A test socket receives one device at a time and is connected to a loadboard. At most perhaps four different test sockets can be located simultaneously on a single loadboard. The loadboard may be located within a thermal chamber to test a device (or as many as are provided on the loadboard) at a desired temperature.

Another method of testing individual devices involves slides. Devices to be tested are loaded into rails or tubes and are allowed to slide into a thermal chamber where they are brought to a desired temperature. One device at a time is loaded into a contactor mechanism that brings a test head into contact with the devices.

SUMMARY OF THE INVENTION

According to the present invention there is provided apparatus for supporting singulated electronic devices during a testing operation, comprising: a main body and a support member, wherein said support member is made of non-conducting high-resistivity material and comprises a plurality of recesses, each said recess being adapted to receive an individual singulated device.

Preferably means are provided associated with each recess for releasably holding a singulated device in the recess. For example the holding means may comprise suction means or gripping means.

In preferred embodiments of the invention the recesses are shaped so as to conform to the shape of a device to be received therein. In one example, each recess is formed with sides that taper inwardly towards the bottom of the recess, at least two raised projecting portions for supporting the leads of a device and for defining a space for receiving the body of a device. Such a recess would be useful for receiving devices formed with leads. Another example of a recess is shallow and formed with a flat bottom surface for receiving therein generally planar leadless devices.

Different support members may be used with the same main body depending on the nature of the devices to be tested, and the support members can be readily interchanged. Potentially a plurality of support members may be located on a single main body.

Preferably the main body is formed with an embedded heating element for heating electronic devices to be tested.

Viewed from another aspect the present invention also extends to apparatus for testing singulated electronic devices, comprising: a plurality of carrier means, each said carrying means being adapted to carry a plurality of singulated devices, input means for placing singulated devices onto said carrier means, at least one environmental control means for subjecting said devices to be tested to selected environmental conditions, a test head, means for removing tested devices from said carrier means for further processing, and means for conveying said carrier means between said input means, said environmental control means, said test head, and said removing means.

Viewed from a still further aspect the present invention extends to apparatus for testing singulated electronic devices, comprising: a plurality of carrier means, each said carrying means being adapted to carry a plurality of singulated devices, input means for placing singulated devices onto said carrier means, a test head, means for removing tested devices from said carrier means for further processing, and means for conveying said carrier means between said input means, said test head, and said removing means.

Viewed from a still further aspect the present invention extends to a method of testing singulated electronic devices, comprising: placing a plurality of singulated devices on a carrier means, conveying said carrier means to a test head, conveying said carrier means from said test head to an output location, and removing said singulated devices from said carrier means.

BRIEF DESCRIPTION OF THE DRAWINGS

Some embodiments of the present invention will now be described by way of example and with reference to the accompanying drawings, in which.

DETAILED DESCRIPTION OF PREFERRED EMBODIMENTS

Figure 1:
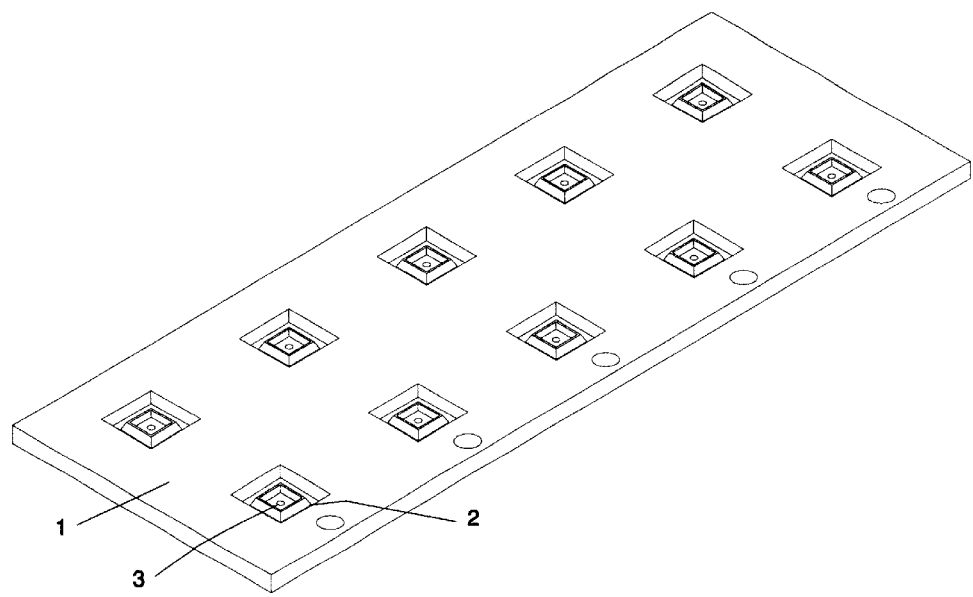
FIG. 1 is a perspective view of a support member for singulated devices according to a first embodiment of the invention.

Referring firstly to FIG. 1 there is shown a support member 1 for carrying a plurality of singulated semiconductor devices through a testing process. The support member 1 comprises a generally rectangular member formed of a non-conducting material of high electrical resistance such as Torlon provided by Amoco Polymers Inc. Within the upper surface of the support member 1 are formed a plurality of recesses 2 each sized and shaped so as to receive a single singulated device to be tested. In the embodiment shown in FIG. 1, ten such recesses 2 are provided in two rows of five, but it will be understood that the number can be greater or smaller than ten and the recesses may be provided in various configurations. With the exception of a suction hole 3 formed in each recess and which extends through the support member as will be discussed below, the recesses are formed in the upper surface of the support member 1 but do not extend therethrough.

Figure 5:
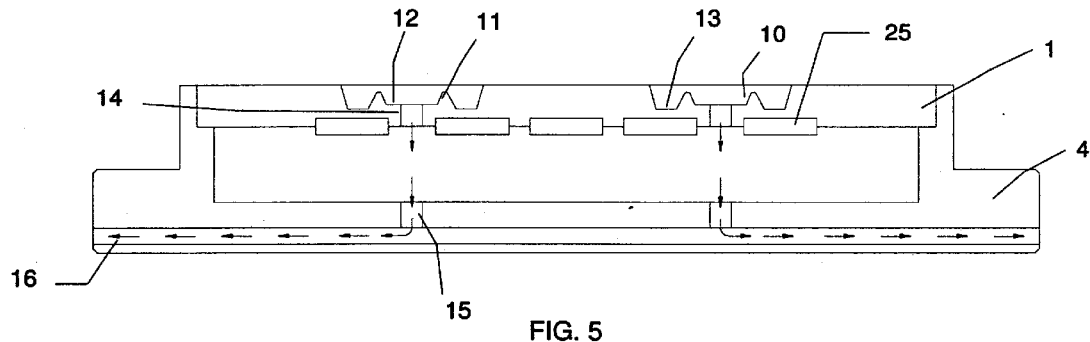
FIG. 5 is a section through the support member of FIG. 1 located on a carrier member of FIG. 1 showing the use of suction to hold singulated devices on the support member.
Figure 6:
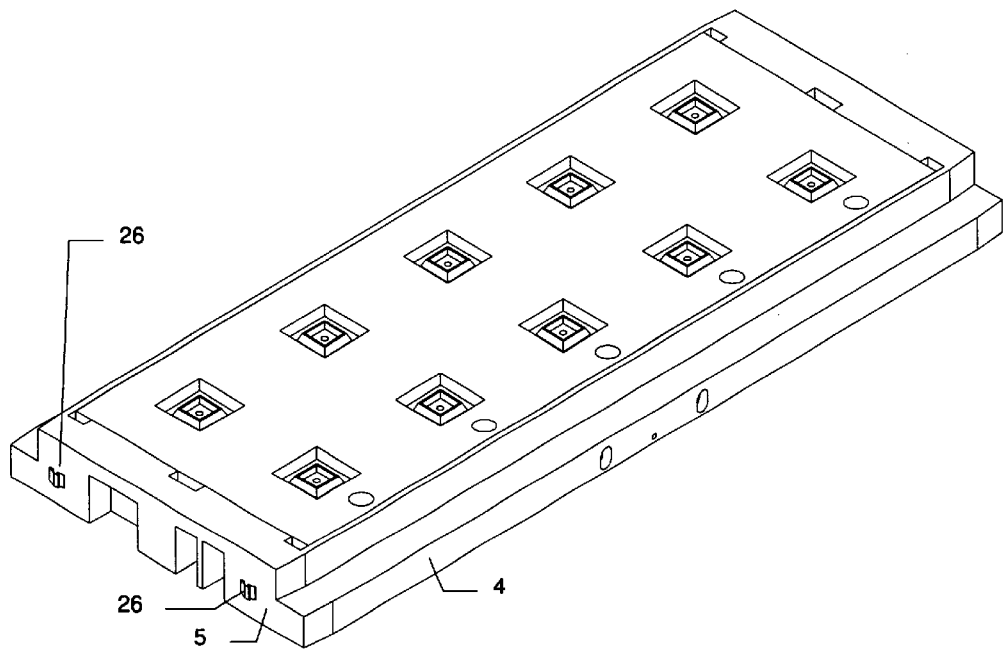
FIG. 6 is a perspective view of the combination of the support member of FIG. 1 located on a carrier member.

FIG. 6 shows in perspective the combination of the device support member 1 and a main body 4. The main body 4 is formed of a conducting material coated with a non-conducting material. The main body is formed to be generally rectangular and slightly larger than the support member 1. In an upper surface of the main body 4 is formed a recess defined by shoulder portions 5 of the main body. As can be seen from FIG. 6 the recess is of the same size as the support member 1 which rests on the shoulder portions 5. FIG. 5 is a sectional view through FIG. 6.

Figure 2:
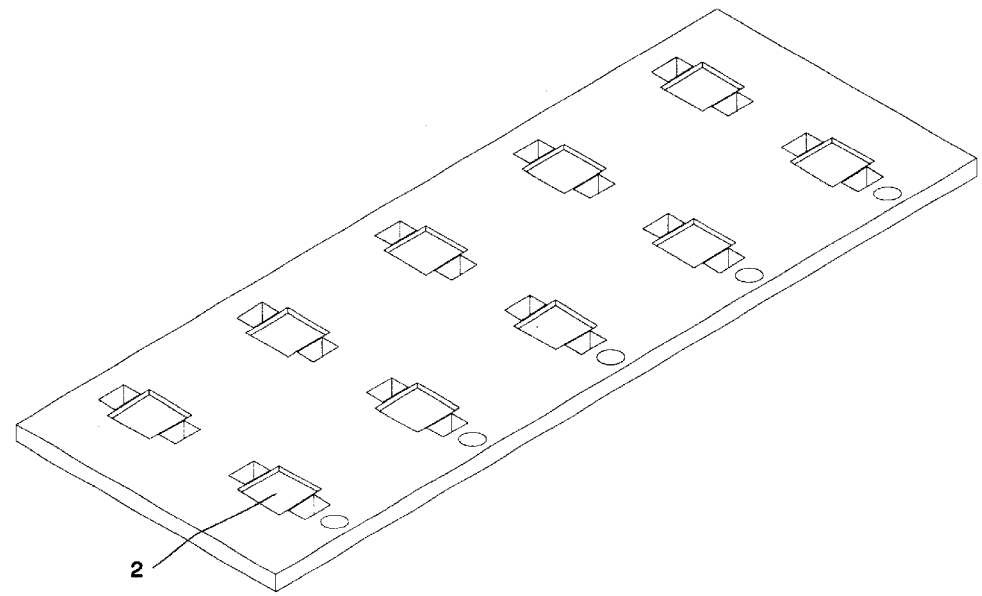
FIG. 2 is a perspective view of the combination of a support member according to a second embodiment of the invention.
Figure 4:
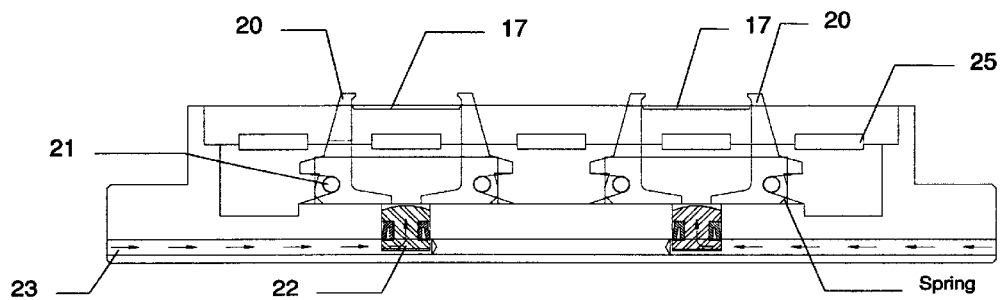
FIG. 4 is a section through support member of FIG. 2 located on a carrier member showing the use of gripping means to hold singulated devices on the support member.
Figure 7:
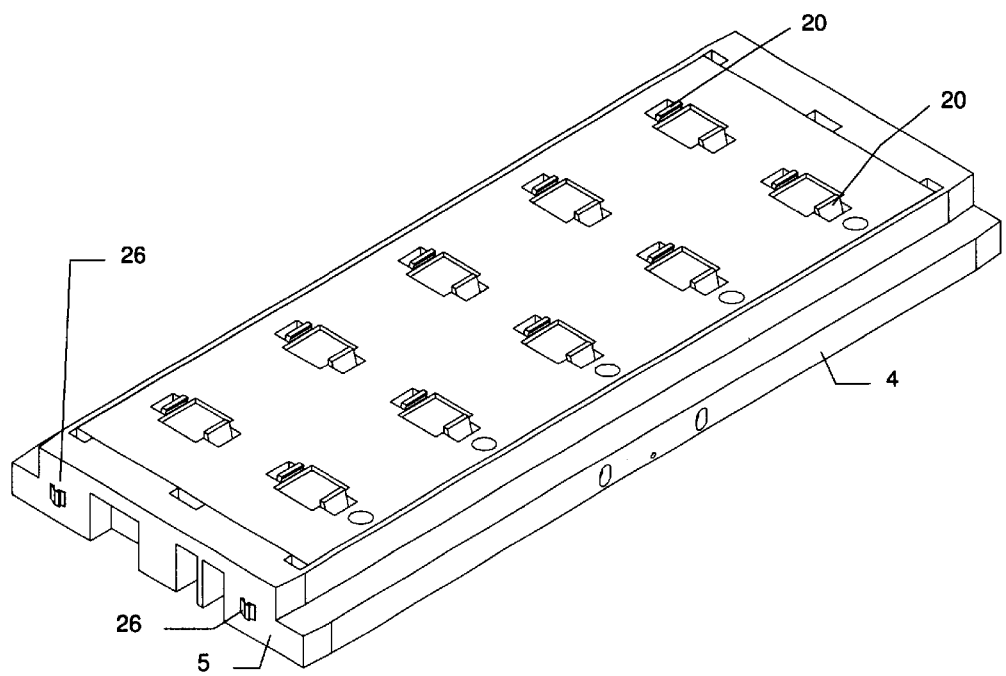
FIG. 7 is a perspective view of the combination of the support member of FIG. 2 located on a carrier member.

FIGS. 2, 4 and 7 show a second embodiment of the invention in which a support member 1 is located within the recess of the main body 4. In this embodiment ten recesses 2 are provided in two rows of five. As will be explained in the following, the two embodiments of FIGS. 1 and 2 are designed for different types of semiconductor devices. In particular the embodiment of FIGS. 1 and 6 is designed in particular for semiconductor devices formed with leads extending from an encapsulated body portion, while the embodiment shown in FIGS. 2 and 7 is designed primarily for leadless devices or area array packages that are relatively thin and which do not have leads extending therefrom.

Referring firstly to FIG. 5 it will be noted that the side walls 10 of the recesses 2 slope inwardly slightly to aid positioning in the recesses of the devices to be connected. Within each recess 2 is formed upstanding guide walls 11, and the surface 12 of the recess within the guide walls 11 is slightly higher than the surface 13 of the recess 2 between the guide walls 11 and the side walls 10. The objective of this design is so that the recess is configured to receive therein a particular packaged semiconductor device for testing. In particular the encapsulated body of the device will be received within the guide walls 11 and resting on the surface 12. The leads of the device will extend at right angles from the body and may rest on the top of the guide walls for support, and then will extend downwardly toward (but not necessarily touching) the surface 13 of the recess 2. It will thus be understood that the size and configuration of the recess will be designed with the size and shape of a particular encapsulated semiconductor device in mind, which may be either an in-line device or a quad device.

Located in the surface 12 within the guide walls 11 is a suction aperture 14 that connects via bore 15 to a suction passage 16 formed in the main body 4. It will be understood that in this way a device may be held in place within a recess 2 by means of suction applied through passage 16, bore 15 and aperture 14. The suction may be provided through a one-way valve (not shown) such that if the carrier is temporarily removed from a source of suction there remains a vacuum beneath the devices so as to ensure that they continue to be held in place. Alternatively the apertures could connect to a single common vacuum chamber formed in the main body and connecting to all the recesses to provide suction thereto.

FIGS. 2, 5 and 7 show an embodiment of the invention designed in particular for use with generally planar semiconductor devices such as leadless devices and area array packages. An important difference between this embodiment and that of FIGS. 1, 4 and 6 is that the devices to be tested are generally planar and relatively thin. Therefore the recesses 2 formed in the support member 1 are correspondingly shallow and there is no need to provide guide walls within the recess. Instead the devices simply rest on the surface 12 of the recess. In this embodiment instead of using suction to hold the devices in the recesses, gripping members 20 are used, with two gripping member 20 being provided on either side of each recess 2. Each gripping member 20 is adapted to pivot about a pivot axis 21 by movement of a pneumatically operated piston 22. Piston 22 is connected to an air supply through passage 23 formed in the main body 4. It will be understood that upon application of air pressure to the piston 22, piston 22 moves upwardly so as to urge the gripping members 20 apart. The gripping members 20 may be spring-biased so that upon removal of the air supply they pivot inwardly toward each other and so as to grip a device held in the recess.

Figure 3:
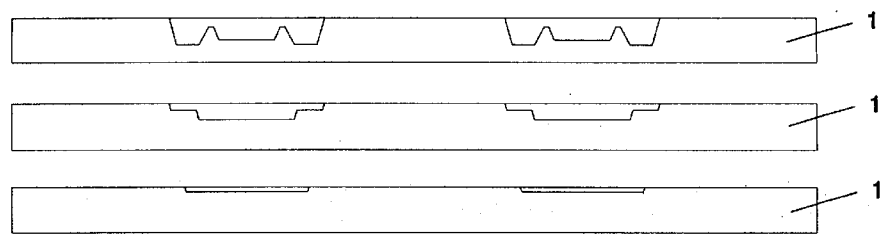
FIG. 3 shows a variety of different support members in cross-section.

It will be understood that the support member is able to carry a number of singulated semiconductor devices at one time. The singulated devices may be placed in the respective recesses by any form of pick and place apparatus and may be held in place either by suction or by the gripping means. Once the singulated devices have been located on the carrier they may be transported to one or more testing locations by moving the carriers on conveying means. It will also be understood that a wide variety of different forms of support member may be provided for different types of singulated devices, and a different form of support member can be fitted to the carrier member depending on the nature of the devices to be tested. As is shown in FIG. 3, the recesses may vary from shallow recesses for thin planar devices, to deep recesses with supporting walls and intermediate depth recesses.

Figure 8:
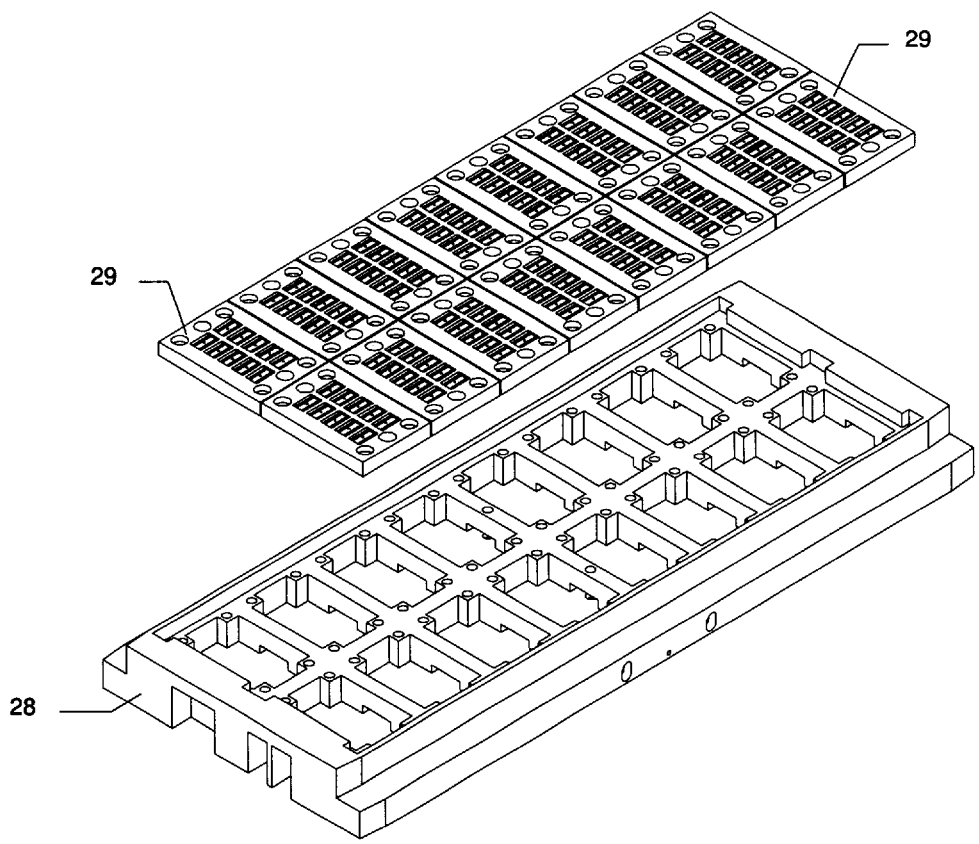
FIG. 8 is a perspective view of the combination of a support member and a carrier member according to another embodiment.

FIG. 8 shows another embodiment of the invention in which a carrier member 28 is adapted to support a number of smaller support members 29 each of which is in turn provided with a plurality of recesses for holding a number of semiconductor devices per support member. Again it will be understood that the number and type of the support members may be varied on the universal carrier member depending on the devices to be tested. By providing multiple smaller support members on a single carrier member, potential difficulties with thermal stress of the support member as it undergoes heating and cooling cycles may be mitigated.

It should also be noted that to facilitate the heating of semiconductor devices for testing purposes, the carrier member may be provided with a number of embedded heating elements, for example strip heating elements extending transversely across the carrier member such as heating elements 25 shown in FIGS. 4 and 5. The embedded heating element(s) may be powered through electrical plugs 26 formed at the end of the carrier member. Power may be applied only when a carrier member is stationary to avoid arcing.

Figure 9:
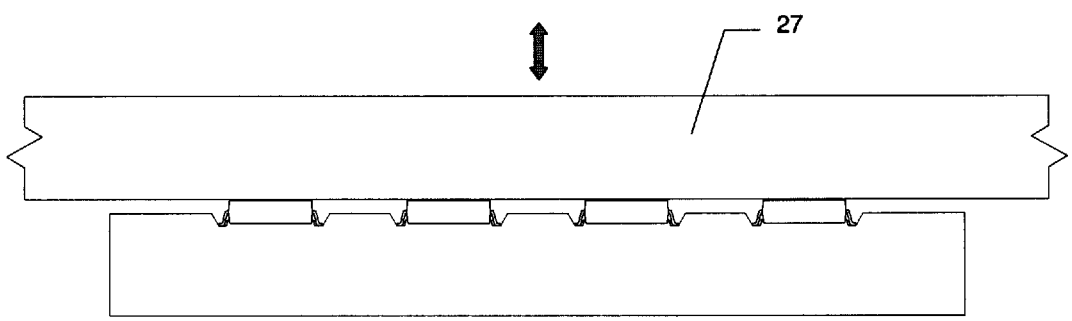
FIG. 9 illustrates the use of an overhead heating element in a testing process.

Another way of heating semiconductor devices for testing purposes is to lower an overhead heating device such as a heating plate 27 (FIG. 9) until it is brought near to or into contact with the devices.

Figure 10:
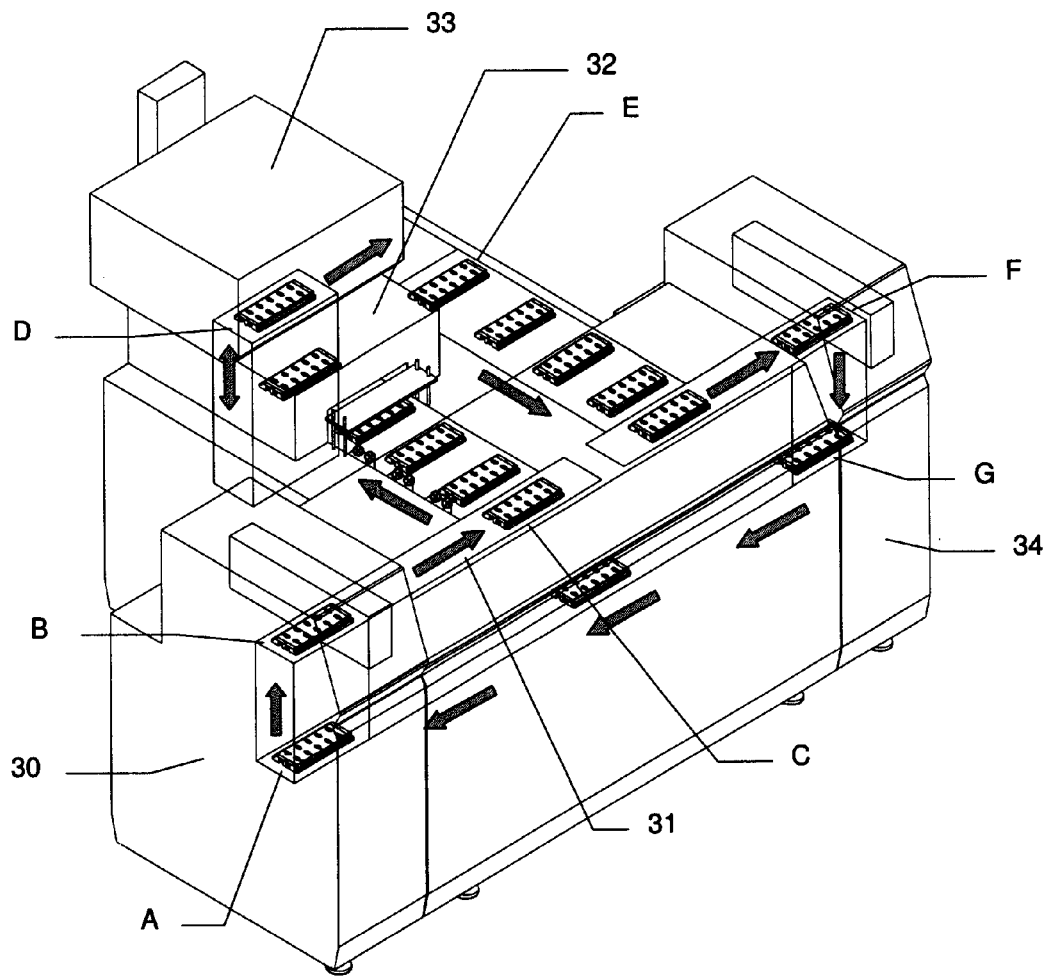
FIG. 10 shows an example of a testing sequence using an embodiment of the present invention.

An example of an environmental testing method and apparatus employing an embodiment of the invention is shown in FIG. 10. FIG. 10 shows the sequence of steps as a carrier is moved through a testing apparatus. The sequence begins at position A where singulated devices to be tested are placed within the recesses formed on the support member. The carrier is then elevated by elevating means 30 to position B. From position B the carrier is moved by kicker means onto a conveyor 31. Conveyor 31 then transports the carrier to position C. from position C the carrier is then moved sideways off the conveyor 31 into an environmental control means 32 which is designed to either heat or cool the devices prior to being tested so that they are tested at a desired temperature. The testing is performed with the carrier at position D by testing means 33. Although not shown in FIG. 10, testing means 33 will include a test probe head comprising a plurality of pogo pins adapted to contact the leads of the singulated devices received within the recesses and to carry out appropriate tests on the devices. The configuration of the test head will depend on the number, type and disposition of the singulated devices on the carrier and may be changed accordingly. The carrier may be provided with appropriate identification means to identify the number, type and disposition of the singulated devices on the carrier so that the configuration of the test head can be set in advance.

Following the testing process, the carrier is moved to position E by a conveyor in a direction parallel to the direction B to C, and is then moved to position F in a direction opposite to the direction C to D. At position F the singulated devices are removed from the carrier. Devices that passed the testing process may be delivered by any suitable means for further processing, while devices that failed the test may be destroyed. The carrier is then lowered by elevator means 34 to a position G level with position A and the empty carrier may be returned by a conveyor back to position A for the cycle to begin again.

It should be noted here that for devices for which the test is ambiguous in the result, the devices may remain on the carrier and may be tested again. Also, if it is desired to test devices repeatedly at the same temperature, the devices may be left on the carrier to be tested again, or the devices may remain on the carrier to be tested a second time, but the environmental control means 32 may be set to provide a different temperature.

Generally, it will be understood that by providing carrier means for carrying a plurality of singulated devices for testing allows a high degree of flexibility, and the ability to construct modular testing facilities. For example, in the embodiment of FIG. 10 it would be possible to provide a second environmental control means and a second testing means so that the devices could be tested at two temperatures sequentially. It will of course be understood that the environmental control means may be provide means for heating or cooling the devices. In the case of heating, the environmental control means may comprise, for example, an oven, or may provide means for supplying power to embedded heating elements as discussed above, or may include an overhead heating element as described with reference to FIG. 9, or a combination of the above. If the environmental control means is a cooling chamber, that may be accomplished, for example, by providing means for introducing a cooling gas such as evaporating liquid nitrogen.

What is claimed is:

1. Apparatus for supporting singulated electronic devices during a testing operation, comprising: a main body and a support member, wherein said support member is made of non-conducting high-resistivity material and comprises a plurality of recesses, each said recess being adapted to receive an individual singulated device.

2. Apparatus as claimed in claim 1 wherein means are provided associated with each said recess for releasably holding a singulated device in said recess.

3. Apparatus as claimed in claim 2 wherein said holding means comprises suction means.

4. Apparatus as claimed in claim 3 wherein each said recess is formed with a suction aperture connected to a suction passageway formed in said main body.

5. Apparatus as claimed in claim 3 wherein each said recess is formed with a suction aperture that connects to a single common vacuum chamber formed in the main body.

6. Apparatus as claimed in claim 2 wherein said holding means comprises gripping means.

7. Apparatus as claimed in claim 6 wherein said gripping means comprises a pair of gripping members disposed on respective sides of each said recess.

8. Apparatus as claimed in claim 7 wherein said gripping members are adapted to pivot between positions in which they engage a device, and positions in which said device is released.

9. Apparatus as claimed in claim 7 wherein said gripping members are adapted to pivot by means of a pneumatically actuated piston member.

10. Apparatus as claimed in claim 1 wherein said recesses are shaped so as to conform to the shape of a device to be received therein.

11. Apparatus as claimed in claim 1 wherein each said recess is formed with sides that taper inwardly towards the bottom of the recess, at least two raised projecting portions for supporting the leads of a said device and for defining a space for receiving the body of a said device.

12. Apparatus as claimed in claim 11 wherein the space defined by said raised projection portions has a surface that is higher than the bottom surface of the remainder of the recess.

13. Apparatus as claimed in claim 1 wherein each said recess is shallow and formed with a flat bottom surface for receiving therein generally planar leadless devices.

14. Apparatus as claimed in claim 1 wherein said support member is located within an opening formed in said main body and rests on shoulder portions of said main body extending along the sides of said opening.

15. Apparatus as claimed in claim 14 wherein a plurality of support members are located on a single main body.

16. Apparatus as claimed in claim 1 wherein the main body is formed with an embedded heating element for heating electronic devices to be tested.

17. Apparatus for testing singulated electronic devices, comprising: a plurality of carrier means, each said carrier means being adapted to carry a plurality of singulated devices, input means for placing singulated devices onto said carrier means, at least one environmental control means for subjecting said devices to be tested to selected environmental conditions, a test head, means for removing tested devices from said carrier means for further processing, and means for conveying said carrier means between said input means, said environmental control means, said test head, and said removing means.

18. Apparatus for testing singulated electronic devices, comprising: a plurality of carrier means, each said carrier means being adapted to carry a plurality of singulated devices, input means for placing singulated devices onto said carrier means, a test head, means for removing tested devices from said carrier means for further processing, and means for conveying said carrier means between said input means, said test head, and said removing means.

19. A method of testing singulated electronic devices, comprising:

placing a plurality of singulated devices on a carrier means that includes one or more support members made of a non-conducting high-resistivity material and comprises a plurality of recesses, each said recess being adapted to receive an individual singulated device, conveying said carrier means to a test head, conveying said carrier means from said test head to an output location, and removing said singulated devices from said carrier means.

\* \* \* \* \*